US009263345B2

(12) United States Patent
Goto et al.

(10) Patent No.: US 9,263,345 B2
(45) Date of Patent: Feb. 16, 2016

(54) SOI TRANSISTORS WITH IMPROVED SOURCE/DRAIN STRUCTURES WITH ENHANCED STRAIN

(75) Inventors: Ken-Ichi Goto, Hsin-Chu (TW); Dhanyakumar Mahaveer Sathaiya, Hsinchu (TW); Ching-Chang Wu, Douliu (TW); Tzer-Min Shen, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 21 days.

(21) Appl. No.: 13/451,696

(22) Filed: Apr. 20, 2012

(65) Prior Publication Data
US 2013/0277685 A1    Oct. 24, 2013

(51) Int. Cl.
H01L 29/78      (2006.01)
H01L 21/336    (2006.01)
H01L 21/84      (2006.01)
H01L 29/66      (2006.01)
H01L 27/12      (2006.01)
H01L 29/165    (2006.01)
H01L 21/38      (2006.01)

(52) U.S. Cl.
CPC ............. *H01L 21/84* (2013.01); *H01L 21/845* (2013.01); *H01L 27/1203* (2013.01); *H01L 27/1211* (2013.01); *H01L 29/66795* (2013.01); *H01L 29/785* (2013.01); *H01L 29/7848* (2013.01)

(58) Field of Classification Search
CPC ............ H01L 27/1203; H01L 29/0878; H01L 29/772; H01L 29/78; H01L 29/165; H01L 29/66621; H01L 29/66636; H01L 29/6659; H01L 29/66772; H01L 29/7848; H01L 21/76254; H01L 21/2253; H01L 21/336; H01L 21/38; H01L 21/2652; H01L 21/02636; H01L 21/823814; H01L 21/823807
USPC .................................. 257/347, 371, 374, 377
See application file for complete search history.

(56) References Cited

U.S. PATENT DOCUMENTS

| | | | | |
|---|---|---|---|---|
| 5,811,342 | A * | 9/1998 | Wu ................................ | 438/303 |
| 7,015,549 | B2 * | 3/2006 | Kim et al. ..................... | 257/347 |
| 7,132,338 | B2 * | 11/2006 | Samoilov et al. ............. | 438/300 |
| 2003/0124823 | A1 * | 7/2003 | Jain et al. ...................... | 438/528 |
| 2007/0096148 | A1 * | 5/2007 | Hoentschel et al. .......... | 257/192 |
| 2008/0029815 | A1 * | 2/2008 | Chen et al. .................... | 257/347 |
| 2008/0061379 | A1 * | 3/2008 | Chen et al. .................... | 257/382 |
| 2008/0085580 | A1 * | 4/2008 | Doyle et al. ................... | 438/231 |
| 2008/0102573 | A1 * | 5/2008 | Liang et al. ................... | 438/231 |
| 2008/0179636 | A1 * | 7/2008 | Chidambarrao et al. ..... | 257/255 |
| 2009/0289305 | A1 * | 11/2009 | Majumdar et al. ............ | 257/351 |
| 2010/0237417 | A1 * | 9/2010 | Wang et al. ................... | 257/347 |

* cited by examiner

*Primary Examiner* — Julia Slutsker
*Assistant Examiner* — Natalia Gondarenko
(74) *Attorney, Agent, or Firm* — Duane Morris LLP

(57) ABSTRACT

A transistor structure with improved device performance, and a method for forming the same is provided. The transistor structure is an SOI (silicon-on-insulator) transistor. In one embodiment, a silicon layer over the oxide layer is a relatively uniform film and in another embodiment, the silicon layer over the oxide layer is a silicon fin. The transistor devices include source/drain structures formed of a strain material that extends through the silicon layer, through the oxide layer and into the underlying substrate which may be silicon. The source/drain structures also include portions that extend above the upper surface of the silicon layer thereby providing an increased volume of the strain layer to provide added carrier mobility and higher performance.

20 Claims, 4 Drawing Sheets

SOI TRANSISTORS WITH IMPROVED SOURCE/DRAIN STRUCTURES WITH ENHANCED STRAIN

TECHNICAL FIELD

The disclosure relates to semiconductor devices and methods for manufacturing the same. More particularly, the disclosure relates to transistors such as SOI-MOSFET devices with improved device performance due to improved source/drain structures having enhanced strain.

BACKGROUND

Metal oxide semiconductor field effect transistor (MOSFET) devices fabricated on SOI (silicon on insulator) substrates offer advantages of low-voltage and high speed operation. SOI-MOSFETs have a comparatively simple construction and a smaller layout as compared with bulk silicon transistor devices. SOI transistors have therefore become increasingly popular in today's semiconductor manufacturing industry where there is a constant push to reduce the layout size of devices and increase device speed and performance.

SOI-MOSFET and other SOI transistor devices are formed on substructures that include an upper silicon layer formed over an oxide layer formed over a bulk substrate. To achieve better short channel effects, the silicon layer atop the oxide layer is formed to be very thin.

SOI-MOSFET devices, other MOSFET devices and other semiconductor device transistors benefit from strain enhancement in the source/drain regions. This is true for PMOS and NMOS technologies. The increased strain is known to improve device performance and device speed. Source/drain regions of transistors are generally formed in the substrate over which the transistor gate is formed and for SOI-MOSFET devices, the source/drain regions are formed in the upper silicon layer.

With the source/drain regions formed in the necessarily thin upper silicon layer, one shortcoming of SOI transistor devices is the inability to improve device performance by introducing strain materials in the source/drain regions.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure provides for forming transistor devices such as MOSFET's, on SOI substructures. The disclosure provides for forming strain regions of increased volume as part of the source/drain structures. An overview of the method used to form various transistors according to the disclosure, is provided in FIG. 1. Further details of the method and structures formed according to the methods are provided in conjunction with the subsequent figures.

Figure 1:
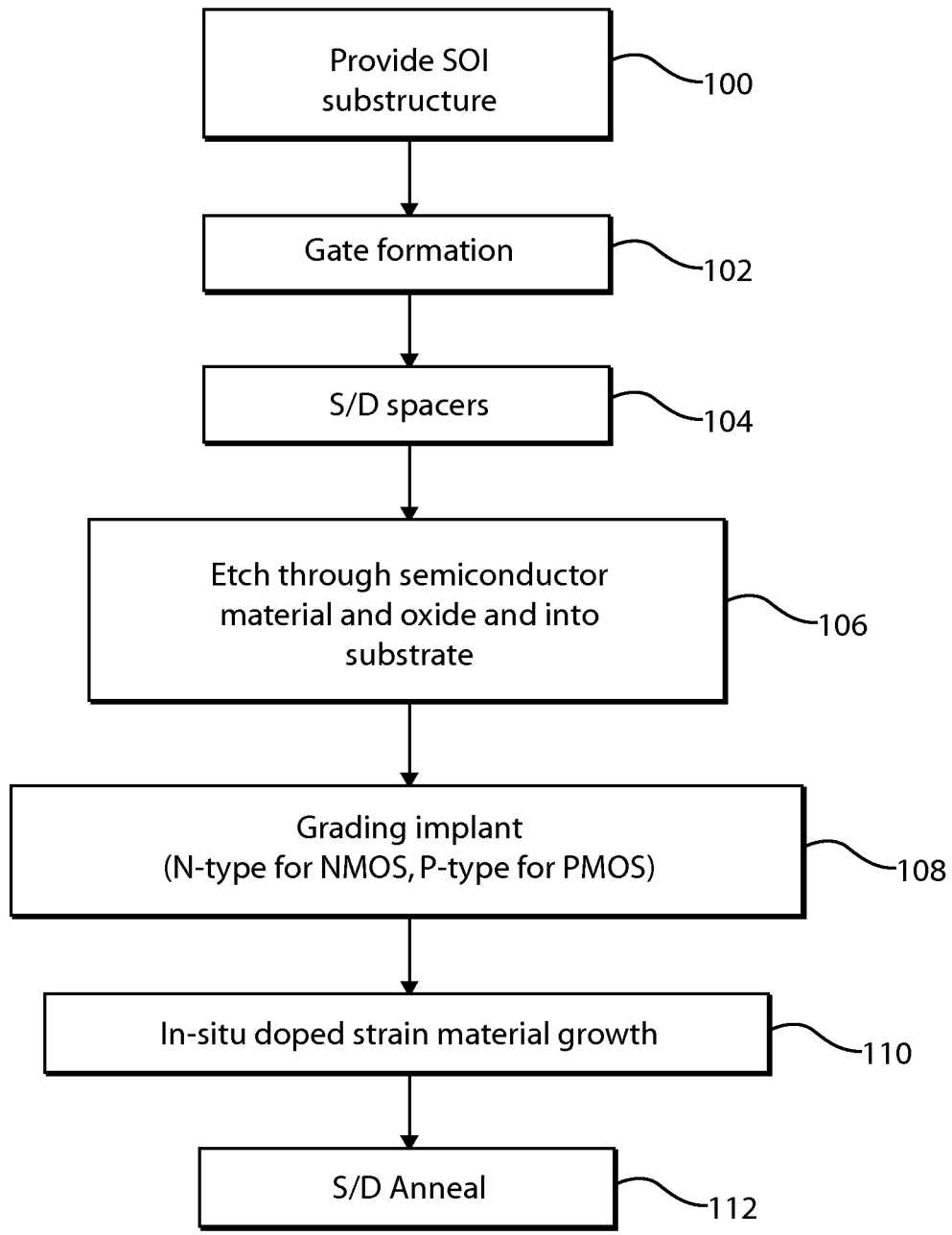
FIG. 1 is a flowchart of an embodiment of a method for forming SOI-MOSFET devices according to the disclosure.

FIG. 1 is a flowchart describing a broad method for carrying out the formation of transistors on SOI substrates. At step 100, an SOI substructure is provided. The SOI substructure is a substructure with silicon, or another suitable semiconductor material, formed over an oxide formed over a semiconductor or other bulk substrate. The semiconductor material may be silicon or other materials and may be in the form of a layer formed over the substrate or a fin formed and defined over the substrate. Step 102 provides for the formation of a gate structure. Step 104 provides for the formation of source/drain spacers along sidewalls of the gate structure and is an optional step. Step 106 provides for etching through the semiconductor material, the oxide and into the underlying substrate to form openings. Step 108 provides for a grading implant involving the introduction of dopant species into the substrate beneath the opening formed at step 106. Ion implantation or other methods to introduce dopant impurities are used but step 108 is not used in all embodiments. The grading implant is technology specific with N-type dopants used for NMOS transistors and P-type dopants used for PMOS transistors. Step 110 provides for in-situ doped strained material growth to form a plug of strained material that fills the opening and extends above the upper surface of the semiconductor material. Step 110 is also technology specific with dedicated materials used for NMOS transistors and other materials used for PMOS transistors. Step 112 is a source/drain annealing process.

Figure 2A:
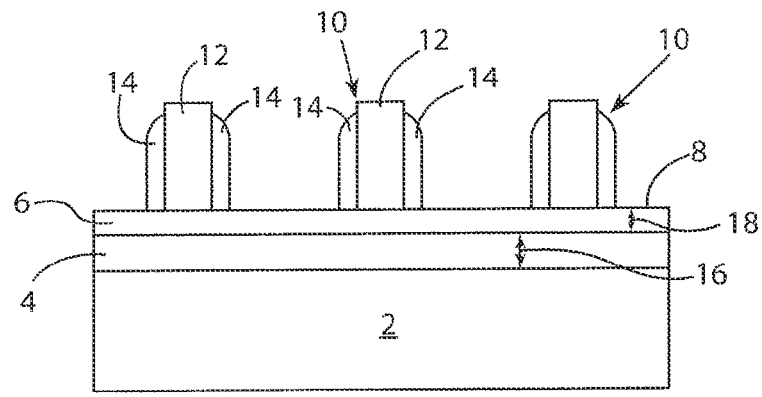
FIGS. 2A-2C are cross-sectional views showing a sequence of processing operations used to form SOI-MOSFET devices with increased amounts of strain material in source/drain regions according to an embodiment of the disclosure.

FIG. 2A is a cross-sectional view showing substrate 2. Substrate 2 is silicon in one embodiment and substrate 2 is formed of other suitable materials in other embodiments. Oxide layer 4 is formed over substrate 2 and semiconductor material 6 is formed over oxide layer 4. Oxide layer 4 may be silicon dioxide or other suitable oxide materials. Various formation methods are used to form oxide layer 4. Oxide layer 4 is often referred to as a buried oxide, BOX, because it is situated beneath semiconductor material 6. In one embodiment, semiconductor material 6 is silicon. Semiconductor material 6 includes top surface 8. In one embodiment, semiconductor material 6 is crystalline silicon and in other embodiments, semiconductor material 6 is polycrystalline or amorphous silicon. In other embodiments, semiconductor material 6 is other suitable semiconductor materials.

Figure 2B:
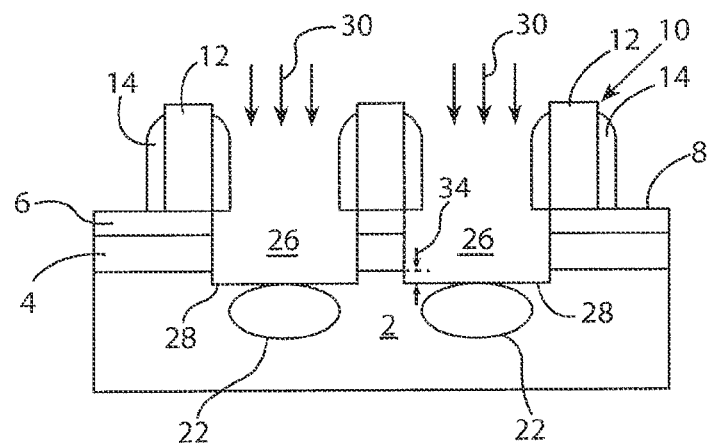
Figure 2C:
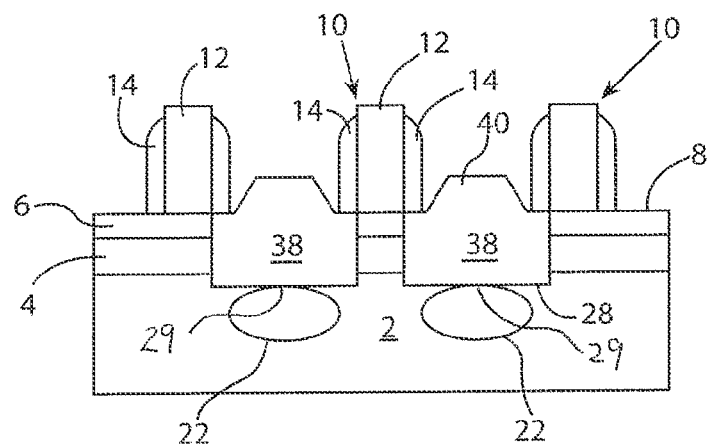

Gate structures 10 are formed over semiconductor material 6 and a gate oxide is present between gate structures 10 and semiconductor material 6 but not visible in the illustration of FIGS. 2A-2C. Gate structures 10 include gate electrode 12 and spacers 14. In one embodiment, gate structure 10 is a gate structure for an NMOS transistor and in another embodiment, gate structure 10 is a gate structure for a PMOS transistor. Gate electrode 12 is formed of doped or undoped polysilicon in some embodiments. In other embodiments, gate electrode 12 is formed of a material having a work function suitable and compatible with the type of transistor—NMOS or PMOS—being formed. Spacers 14 are formed alongside the sidewalls of gate electrode 12 and are formed of nitride, oxynitride, or other suitable spacer materials. Spacers 14 are formed by depositing a thick layer of the spacer material over a structure including over the gate electrodes, then carrying out an isotropic etch to produce spacers 14, in some embodiments. In some embodiments, spacers 14 are not used.

Oxide layer 4 includes thickness 16. In one embodiment, thickness 16 lies within the range of 10-30 nm but thickness 16 takes on other values in other embodiments. In one embodiment, semiconductor material 6 is a film or layer of substantially uniform thickness substantially covering oxide layer 4. Semiconductor material 6 includes thickness 18 which is 5-20 nm according to one embodiment in which semiconductor material 6 is the film or layer of substantially uniform thickness. In other embodiments, thickness 18 of semiconductor material 6 takes on other values. According to other embodiments, semiconductor material 6 is a fin with a considerably greater thickness. A fin embodiment will be shown in FIGS. 4A and 4B. Conventional and other methods are available and various suitable processes are available to form the structure shown in FIG. 2A.

FIG. 2B shows the structure of FIG. 2A after openings 26 have been formed. Openings 26 extend through semiconductor material 6, through oxide layer 4 and into substrate 2. Openings 26 are formed to various depths. The overall depth of openings 26 depend upon the thickness of semiconductor material 6 and oxide layer 4 and the extent that openings 26 extend into substrate 2. Depth 34 represents the depth of the recess formed extending into substrate 2. In one embodiment, depth 34 is about 10-30 nanometers but depth 34 has other values in other embodiments. Various etching operations are used to form openings 26 in between and adjacent gate structures 10. More particularly, various sequences of etching operations are used to etch through semiconductor material 6, oxide layer 4 and into substrate 2. In one embodiment, an etching operation that undercuts spacers 14 is used and openings 26 extend laterally to gate electrodes 12 and include portions beneath spacers 14. Openings 26 include bottom surfaces 28.

FIG. 2B also shows grading dopant areas 22. Arrows 30 indicate the introduction of dopant impurities into bottom surface 28 of substrate 2 to form grading dopant areas 22 and in one embodiment, arrows 30 indicate the introduction of dopant impurities into bottom surface 28 of substrate 2 via ion implantation. Grading dopant areas 22 include N-type dopant impurities when used in conjunction with NMOS transistors and P-type dopant impurities when used in conjunction with PMOS transistors. Various suitable N-type and P-type dopant impurities are used in various embodiments. One suitable P-type dopant impurity is boron and suitable N-type impurities include phosphorous and arsenic. Other dopant impurities are used in other embodiments. The introduction of grading dopant impurities is advantageously used to prevent junction leakage but is not used in some embodiments. In one embodiment, an ion implantation operation is used. In other embodiments, other methods for introducing dopant impurities into bottom surface 28 of substrate 2, are used to form grading dopant areas 22. In one embodiment, the dopant impurities are formed to a concentration of about 1e19 cm$^{-3}$, but the concentration of grading dopant areas 22 varies from 1e18 to 5e19 cm$^{-3}$ in other embodiments. The grading implant operation, i.e. grading dopant areas 22, are not used in some embodiments.

Openings 26 of FIG. 2B are each filled with a suitable strain material to produce the structure shown in FIG. 2C. Strained layers or materials are used in semiconductor devices because the biaxial tensile or compressive strain produced by the strain material alters the carrier mobilities in the layers, enabling the fabrication of high-speed devices, low-power devices, or both.

FIG. 2C shows strain materials 38 formed within previous openings 26 and extending above top surface 8 of semiconductor material 6. In one embodiment, top surfaces 40 of strain materials 38 are disposed above top surface 8 by about 20-30 nm but other dimensions are used in other embodiments. Strain materials 38 serve as source/drain regions in their associated transistors, i.e. in conjunction with the transistor gate 10 that is adjacent to strain material 38. Strain materials 38 extend laterally to gate electrode 12 and under spacers 14 in various embodiments. Strain materials 38 are used with PMOS transistors and NMOS transistors and the materials used to form strain materials 38 are chosen in conjunction with the associated transistor type. When used in conjunction with PMOS transistors, strain material 38 is SiGe or other materials with similar lattices that are similar to that of SiGe. When used in conjunction with NMOS transistors, strain material 38 is SiC in one embodiment but other materials with lattice structures similar to SiC are used in other NMOS transistor embodiments.

In one embodiment, strain materials 38 are formed using selective epitaxial growth. Other formation methods are used in other embodiments. According to various embodiments for forming both NMOS and PMOS transistors, an in-situ doping operation is carried out in conjunction with the epitaxial formation process. When used in conjunction with NMOS transistors, strain materials 38 are doped with phosphorus or other suitable dopants used for NMOS transistors, and when used in conjunction with PMOS transistors, strain materials 38 are doped with boron or other suitable dopants used for PMOS transistors. Other dopant species are used in other embodiments. A source/drain annealing operation is then carried out to anneal the structures. Various types of annealing operations with various conditions, are used in various embodiments. Grading dopant areas 22 are disposed under respective bottom surfaces 28 of former openings 26 and also below strain materials 38 which serve as source/drain regions and fill former openings 26. Graded dopant areas 22 do not overlap the strain materials 38 serving as source/drain regions. Interface 29 is the interface between the respective grading dopant areas 22 and the strain materials 38 serving as the source/drain regions and the common boundary at which the grading dopant areas 22 directly contact the strain materials 38 serving as the source/drain regions. As such, since grading dopant areas 22 are disclosed to be disposed below strain materials 38 which serve as source/drain regions.

The transistor embodiments illustrated in FIG. 2C undergo various additional processing operations and are coupled to various other semiconductor devices and structures using suitable circuitry to form any of various integrated circuits and other types of semiconductor devices.

Figure 3A:
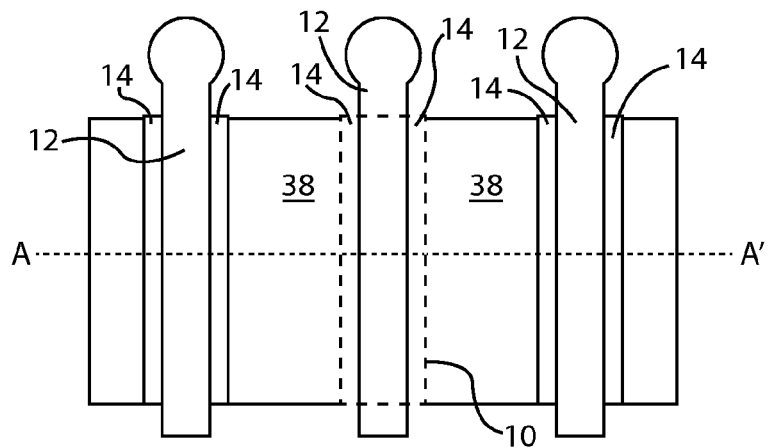
FIGS. 3A and 3B are a top view and cross-sectional view, respectively, of an embodiment of an SOI transistor according to the disclosure.
Figure 3B:
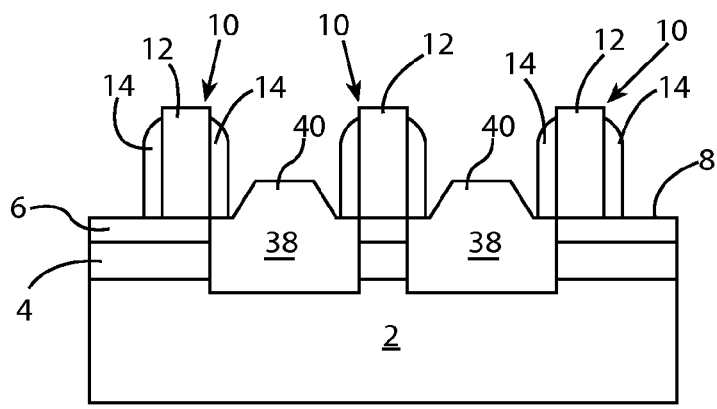

FIGS. 3A and 3B are a top and cross-sectional view, respectively, of planar SOI-MOSFET transistor devices. FIG. 3A is a top view showing three transistor gate structures 10, each including gate electrode 12 and spacers 14. Strain materials 38 are formed between the transistor structures as described above.

FIG. 3B is substantially similar to FIG. 2C and represents a planar SOI-MOSFET device but does not include grading dopant area 22.

Figure 4A:
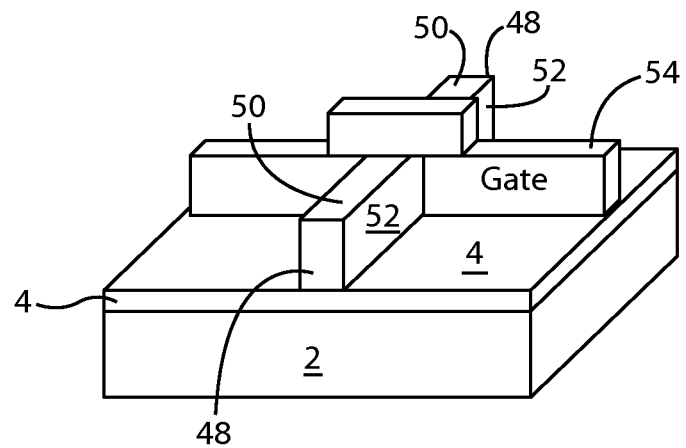
FIGS. 4A and 4B are a perspective view and cross-sectional view, respectively, of an SOI FinFET device according to an embodiment of the disclosure.
Figure 4B:
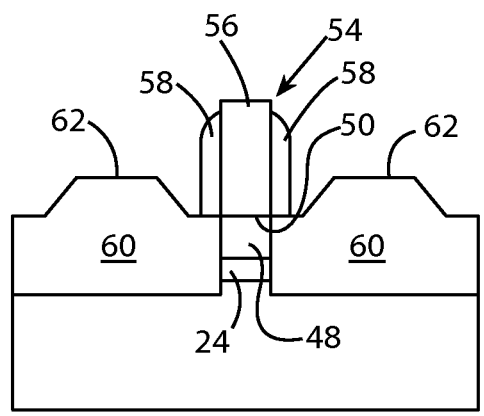

FIGS. 4A and 4B show an SOI FinFET structure according to the disclosure. The structure shown in FIG. 4A is formed using the same sequence of processing operations described in conjunction with FIG. 2A and covered in the flowchart of FIG. 1. In the FinFET embodiment illustrated in FIGS. 4A and 4B, the semiconductor material formed over oxide layer 4 is formed as a fin device. Semiconductor fin 48 includes top surface 50 and side surfaces 52. Semiconductor fin 48 is formed of silicon in one embodiment. Semiconductor fin 48 is formed of other suitable materials in other embodiments. Various patterning and etching operations are used to form semiconductor fin 48.

Fin gate structure 54 is formed over semiconductor fin 48 including over top surface 50 and side surfaces 52. In the embodiment of FIG. 4B, fin gate structure 54 extends orthogonally with respect to semiconductor fin 48 and includes gate electrode 56 and spacers 58, although spacers 58 are not used in some embodiments. The gate oxide present between gate electrode 56 and semiconductor fin 48 is not visible in FIGS. 4A and 4B. Various patterning and etching operations are used to form fin gate structure 54 that extends over semiconductor fin 48.

In one embodiment, FIG. 4B is a cross-section taken along the line bisecting semiconductor fin 48 of FIG. 4A, and after spacers and strain materials are formed.

FIG. 4B shows substrate 2, oxide layer 4, and semiconductor fin 48 with fin gate structure 54 formed over top surface 50 of semiconductor fin 48. In the embodiment of FIG. 4B, fin gate structure 54 includes gate electrode 56 and spacers 58. Gate electrode 56 and spacers 58 are formed of the materials described in conjunction with FIGS. 2A-2C, in various embodiments. Strain materials 60 are formed as described in conjunction with FIGS. 2A-2C and using materials described in conjunction with FIGS. 2A-2C. In particular, openings are formed adjacent fin gate structure 54 and extending through semiconductor fin 48 and oxide layer 4 and into substrate 2. Although not illustrated in FIG. 4B, various SOI FinFET embodiments also include grading dopant areas beneath strain materials 60. Strain materials 60 are formed as described above and extend into substrate 2 and encroach beneath spacers 58, extending laterally to gate electrode 56. Strain materials 60 include upper surfaces 62 disposed above top surface 50 of semiconductor fin 48 in the illustrated embodiment. Top surface 62 may be at other heights in other embodiments. Various source/drain annealing operations are used to anneal the structure of FIG. 4B, including strain materials 60 which are doped with suitable dopant impurities as described in conjunction with strain materials 38 of FIG. 2C.

According to one aspect, a semiconductor device is provided. The semiconductor device includes an SOI (silicon on insulator) transistor device comprising: a substructure including a silicon substrate, a buried oxide layer formed over the silicon substrate and a crystalline silicon material formed over the buried oxide layer; a gate structure formed over the crystalline silicon material; and source/drain structures disposed adjacent the gate structure, the source/drain structures formed of a strain material and disposed in an opening that extends through the crystalline silicon material and the buried oxide layer, and into the silicon substrate. The source/drain structures each have an upper portion extending above the crystalline silicon material According to another aspect, a semiconductor device is provided. The semiconductor device includes an SOI (silicon on insulator) transistor device comprising: a substructure including a silicon substrate, a buried oxide layer disposed on the silicon substrate and a crystalline silicon material disposed on the buried oxide layer; a gate structure formed over the crystalline silicon material, the gate structure including a gate electrode and source/drain spacers along sidewalls of the gate electrode; source/drain structures disposed adjacent opposite sides of the gate electrode, the source/drain structures formed of a strain material filling an opening that extends through the crystalline silicon material and the buried oxide layer and into the silicon substrate, including beneath the source/drain spacers, the source/drain structures each having an upper portion disposed above an upper surface of the crystalline silicon material. Dopant impurity regions are disposed in the semiconductor substrate beneath each the source/drain structure.

According to another aspect, a method for forming a transistor on a silicon-on-insulator (SOI) substructure, is provided. The method comprises: providing a semiconductor substrate; forming an oxide layer over the semiconductor substrate; forming a crystalline silicon material over the oxide layer; forming a gate structure over the crystalline silicon material; creating openings extending through the oxide layer and the crystalline silicon material and extending into the semiconductor substrate, adjacent the gate structure; and filling the openings with a strain material, the strain material including a top surface above an upper surface of the crystalline silicon material.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:
1. A semiconductor device comprising:
a substructure including a substrate that is silicon, a buried oxide layer formed over said silicon substrate and a crystalline silicon material formed over said buried oxide layer, the substructure including openings extend- ing from a top surface of the crystalline silicon material through the buried oxide layer and into the substrate;

a plurality of gate structures formed over said crystalline silicon material, a gate structure of the plurality of gate structures having a pair of sidewall spacers with a gate electrode therebetween;

source/drain structures disposed adjacent said gate electrode, said source/drain structures comprising a strain material that is a different material than said silicon substrate, the strain material filling the openings, the strain material having an upper portion extending above said crystalline silicon material; and graded dopant impurity regions in said silicon substrate entirely below the strain material in a region entirely between sidewall spacers of two adjacent gate structures of the plurality of gate structures, the graded dopant impurity regions formed of silicon doped with impurities, the graded dopant impurity regions located beneath respective bottom surfaces of said strain material.

2. The semiconductor device as in claim 1, wherein said semiconductor device comprises a PMOS transistor and said strain material comprises SiGe.

3. The semiconductor device as in claim 1, wherein said semiconductor device comprises an NMOS transistor and said strain material comprises SiC.

4. The semiconductor device as in claim 1, wherein said source/drain structures include a portion disposed beneath said source/drain spacers.

5. The semiconductor device as in claim 1, wherein said semiconductor device comprises an NMOS transistor and wherein said graded dopant impurity regions comprise N-type dopant impurity regions.

6. The semiconductor device as in claim 1, wherein said semiconductor device comprises a PMOS transistor and wherein said graded dopant impurity regions comprise P-type dopant impurity regions.

7. The semiconductor device as in claim 1, wherein said crystalline silicon material comprises a film of substantially uniform thickness.

8. The semiconductor device as in claim 1, wherein said crystalline silicon material comprises a fin and said gate electrode is further formed on sidewalls of said fin.

9. The semiconductor device as in claim 1, wherein said crystalline silicon material comprises a layer having a thickness of about 5-20 nm, said buried oxide has a thickness of about 10-30 nm and said source/drain structures extend into said silicon substrate to a depth of about 10-30 nm.

10. A semiconductor device comprising:
a substructure including a substrate that is silicon, a buried oxide layer disposed on said silicon substrate and a crystalline silicon material disposed on said buried oxide layer, the substructure including openings extending from a top surface of the crystalline silicon material through the buried oxide layer and into the silicon substrate;

a plurality of gate structures formed over said crystalline silicon material, each of said plurality of gate structures including a gate electrode and source/drain spacers along sidewalls of said gate electrode;

source/drain structures disposed adjacent opposite sides of said gate electrode, comprising a strain material that is a different material than said silicon substrate, the strain material filling the openings, the strain material extending beneath said source/drain spacers, the strain material having an upper portion disposed above an upper surface of said crystalline silicon material; and graded dopant impurity regions in said silicon substrate entirely below the strain material in a region entirely between sidewall spacers of two adjacent gate structures of the plurality of gate structures, the graded dopant impurity regions formed of silicon doped with impurities, the graded dopant impurity regions having top surfaces located below a bottom of the strain material.

11. The semiconductor device as in claim 10, wherein said crystalline silicon material comprises a fin and wherein said gate electrode extends over said fin substantially orthogonally and is further disposed on sidewalls of said fin.

12. A method for forming the semiconductor device of claim 1, comprising:
providing the silicon substrate;
forming an oxide layer over said silicon substrate;
forming a crystalline silicon material over said oxide layer so as to bury the oxide layer;
forming the plurality of gate structures over said crystalline silicon material, wherein forming a gate structure of the plurality of gate structures includes forming the gate electrode and forming the sidewall spacers along sidewalls of said gate electrode;
creating the openings adjacent said plurality of gate structures;
forming graded dopant impurity regions in said silicon substrate entirely below the openings, in the region entirely between sidewall spacers of two adjacent gate structures of the plurality of gate structures, the graded dopant impurity regions formed of silicon doped with impurities, and
filling said openings with the strain material that is a different material than said silicon substrate, to form the source/drain structures adjacent the gate electrode, so that the upper portion of the strain material has a top surface above an upper surface of said crystalline silicon material, and so that said graded dopant impurity regions in said silicon substrate are entirely below respective bottom surfaces of said strain material.

13. The method as in claim 12, wherein said creating openings comprises etching through said crystalline silicon material, said oxide layer and into said semiconductor substrate.

14. The method as in claim 12, wherein said transistor comprises a PMOS transistor and said strain material comprises SiGe.

15. The method as in claim 12, wherein said transistor comprises an NMOS transistor and said strain material comprises SiC.

16. The method as in claim 12, wherein said creating openings includes undercutting said sidewall spacers and further includes said openings extending under said sidewall spacers.

17. The method as in claim 12, wherein said openings include bottom surfaces within said silicon substrate and further comprising implanting dopant impurities into said bottom surfaces.

18. The method as in claim 17, wherein said implanting dopant impurities includes introducing said dopant impurities to a concentration from 1e18 to 5e19 $cm^{-3}$, said transistor comprises an NMOS transistor and said introducing dopant impurities includes introducing N-type dopant impurities.

19. The semiconductor device of claim 1, wherein the graded dopant impurity regions have a dopant concentration that varies from $10^{18}$ $cm^{-3}$ to $5\times10^{19}$ $cm^{-3}$.

20. The semiconductor device of claim 10, wherein the graded dopant impurity regions have a dopant concentration that varies from $10^{18}$ $cm^{-3}$ to $5\times10^{19}$ $cm^{-3}$.

* * * * *